United States Patent [19]

Wiedeman

[11] Patent Number: 4,542,256
[45] Date of Patent: Sep. 17, 1985

[54] GRADED AFFINITY PHOTOVOLTAIC CELL

[75] Inventor: Scott Wiedeman, Levittown, Pa.

[73] Assignee: University of Delaware, Newark, Del.

[21] Appl. No.: 604,786

[22] Filed: Apr. 27, 1984

[51] Int. Cl.[4] .................... H01L 31/06; H01L 31/18
[52] U.S. Cl. .................... 136/249; 136/255;
   136/258; 357/2; 357/30; 29/572; 427/74
[58] Field of Search ........ 136/249 TJ, 255, 258 AM;
   357/2, 30; 29/572; 427/74, 39, 86

[56] References Cited

U.S. PATENT DOCUMENTS 4,471,155  9/1984  Mohr et al. .................... 136/258

FOREIGN PATENT DOCUMENTS

58-98988  6/1983  Japan .................... 136/255

Primary Examiner—Aaron Weisstuch
Attorney, Agent, or Firm—Harry J. McCauley

[57] ABSTRACT

An improved photovoltaic cell, and method for its manufacture, comprising front and back electrically conductive layers between which is sandwiched a primary light-absorbing layer of amorphous semiconducting material displaying low photogenerated carrier mobility below about 50 cm$^2$/V second, the constitution of which primary layer is fabricated to provide an affinity gradient reducing back-diffusion of a preselected species of photogenerated carrier (electrons or holes) to thereby forestall non-productive recombination with carriers of opposite type.

8 Claims, 14 Drawing Figures

GRADED AFFINITY PHOTOVOLTAIC CELL

FIELD OF THE INVENTION

This invention concerns the elimination, or at least the substantial minimization, of wasteful recombination of photogenerated carriers at the front (radiation incident) and, optionally, the back faces of photovoltaic cells as a result of back diffusion.

The invention is applicable to amorphous type semiconductors, particularly to amorphous silicon alloy cells displaying low carrier mobility, e.g. less than about 50 cm$^2$/V sec. Preferred species include SiGe, SiC, SiN, SiO, SiSn, and elemental Si optionally containing excess hydrogen or fluorine.

A unique solar cell, and the method for its manufacture, are hereinafter described as an Example.

BACKGROUND OF THE INVENTION

Solar cells in which the active layers are composed of low-mobility semiconductors characteristically exhibit a fall-off in internal collection efficiency under strongly absorbed radiation, contrary to the predictions of simple theory (W. W. Gartner, *Phys. Rev.* 116, 84 (1959)). This effect has been experimentally observed in amorphous (abbreviated a-)Si cells in several configurations, including Schottky barrier devices (D. Gutkowicz-Krusin, C. R. Wronski, and T. Tiedje, *Appl. Phys. Letters* 38(2), 87 (1981)), MIS devices, and homojunction (p-i-n) devices (A. E. Delahoy and R. W. Griffith, *J. Appl. Phys.* 52(10), 6337 (1981)). The effect is attributed in all cases to the back-diffusion of photogenerated carriers toward the illuminated front contacting layer of the cell, where they recombine uselessly (i.e. non-productively) with thermally generated carriers of opposite type. Back-diffusion is most pronounced at short wavelengths, because the carrier concentration gradients which drive it are largest immediately adjacent to the front contacting layer, where short wavelength radiation is absorbed. This interpretation has been supported by two theoretical studies, one involving direct analytical solution of the transport equations (J. Reichman, *Appl. Phys. Letters* 38(4), 251 (1981)) and the other involving computer simulation of transport in an n-i-p structure (G. A. Swartz, *J. Appl. Phys.* 53(1), 712 (1982)). These theoretical studies have been criticized, however, on the ground that the assumption of complete thermalization of the diffusing carriers may be unwarranted (A. Rothwarf, *Appl. Phys. Letters* 40(8), 694 (1982)). Nevertheless it seems well established that back-diffusion constitutes a major recombination pathway, and that its elimination or reduction would lead to higher conversion efficiency.

In order to minimize back-diffusion Reichman (J. Reichman, supra) proposed the use of MIS or semiconductor-electrolyte configurations, in which the necessity to tunnel through an intervening barrier region reduces the effective velocity of carriers moving toward the front surface. This remedy fails in the presence of a high density of interface states (H. C. Card and E. S. Yang, *Appl. Phys. Letters* 29(1), 51 (1976)), and, in any event, is inapplicable to the currently favored n-i-p and p-i-n configurations. In the case of Schottky barrier devices, Reichman proposed to decrease the width of the depletion layer by uniform doping, thereby increasing the drift field opposing back-diffusion. Calculations show a beneficial effect on short wavelength response, but only at the expense of long-wavelength response. Hence this remedy, too, has limited usefulness.

Nevertheless, Reichman's proposal stimulated several experimental investigations of intentionally doped i-layers in n-i-p and p-i-n devices, of which the first appears to be that of Haruki et al. (H. Haruki, H. Sakai, M. Kamiyama, and Y. Uchida, *Solar Energy Materials* 8, 441 (1983)). Maximum conversion efficiency is attained for boron concentrations of the order $(1-3) \times 10^{17}$ atoms/cm$^3$ and is higher for n-i-p than p-i-n devices. The boron concentration profile is essentially uniform throughout the i-layer, except for a narrow ($\approx 500$ Å) transition region adjacent the p-layer. The beneficial effects of boron doping are attributed by these authors to an increase in the hole mobility-lifetime product, and not to an alteration of the internal field profile. Shortly thereafter Moustakas et al. (T. D. Moustakas, H. P. Maruska, R. Friedman, and M. Hicks, *Appl. Phys. Letters* 43(4), 368 (1983)) reported an investigation of the effects of uniform boron doping in Schottky barrier and n-i-p devices. Improved short-wavelength response is found when residual phosphorus impurities in the i-layer are slightly overcompensated. In this case, however, beneficial effects are attributed to the redistribution of internal electric field, without mention of the back-diffusion problem. On the basis of these results Moustakas et al. supra suggest the possibility of tailoring the boron concentration, presumably in a nonuniform manner, in order to achieve an optimum field distribution. Quite recently Hack et al. (M. Hack, M. Shur, W. Czubatyj, and J. McGill, *IEEE Trans. Electron Devices*, May, 1984 (to be published)) have studied, by computer simulation, the effects of "boron profiling" in an n-i-p structure. The investigation is restricted to boron concentration profiles which are uniform throughout the i-layer, or which decay exponentially with distance from the p-layer. Modest increases in open-circuit voltage result.

Despite the potential utility of these dopant profiling techniques in producing a more favorable field distribution, none has yet addressed the problem of suppressing back diffusion near the front contacting layer. Moreover, all dopant profiling techniques suffer a common limitation: they can, at best, redistribute the built-in electrostatic potential difference, which is bounded in turn by the difference in work function between the two ends of the device. Hence, increases in short-circuit current are accompanied, at most, by secondorder increases in open-circuit voltage.

SUMMARY OF THE INVENTION

This invention provides a method of suppressing back-diffusion of photogenerated carriers in which localized electron or hole affinity gradients are introduced into the intrinsic (i) layer wherever it is desired to steer photogenerated carriers away from regions of rapid recombination. The affinity gradients also benefit cell operation, in that they contribute directly to the open circuit voltage, as a result of which there are achieved first-order increases in both open circuit voltage and short circuit current.

The affinity gradients are achieved in the Example hereinafter described by tapering the relative concentration of one ingredient of the intrinsic layer composition to substantially zero in a region adjacent to a contacting layer of the solar cell. However, the cell constitution can be fabricated in other ways, if desired, including post-deposition annealing, heat treatment, hydrogenation, fluorination, ion implantation, irradiation, diffusion or effusion processes, or combinations thereof.

The remedy of this invention appears to be generally applicable to a wide variety of cell configurations and to numerous low mobility amorphous semiconducting material systems.

THE DRAWINGS

The following schematic drawings constitute part of this disclosure, in which:

FIGS. 2E and 2F are equilibrium band diagrams showing the use of localized affinity gradients for both holes and electrons in an n-i-p and a p-i-n structure, respectively, whereas FIG. 3B is a plot of composition v. thickness for the cell of FIGS. 3 and 3A, FIGS. 4 through 6, inclusive are computer-drawn comparison plots of performance characteristics of the cell of FIGS. 3 through 3B, in which

DETAILED DESCRIPTION OF THE INVENTION

In the drawings, the several components are denoted by the following reference numerals, the suffix letters, where appended, identifying the drawing FIGURES where shown:

10—n+ layer
11—graded affinity region
12—intrinsic layer
14—p+ layer
15—rear, or back, graded affinity region
16—front boundary for ungraded affinity intrinic layer
17—rear boundary for ungraded affinity intrinsic layer
20—Fermi level
21—Transparent conductive layer of Indium-Tin Oxide, or Tin Oxide
22—rear, or back, metal contact, molybdenum
23—supporting substrate

THEORY

Figure 1:
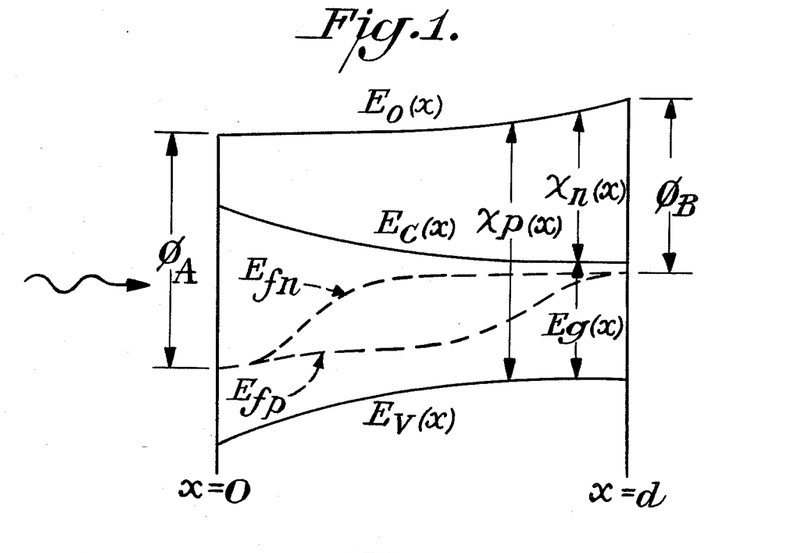
FIG. 1 is a representation of the most general case of an illuminated semiconductor containing affinity gradients, sandwiched between metallic contacts of work function $\Phi_A$ and $\Phi_B$, respectively.

Affinity gradients can be understood in terms of FIG. 1, adapted from Fonash and Ashok (S. J. Fonash and S. Ashok, *Appl. Phys. Letters* 35(7), 535 (1979)). This FIGURE shows the most general band diagram of an isothermal, illuminated semiconducting material in which all characteristic energies, E, are permitted to vary with a single space coordinate, x. $E_o$ is the local vacuum level, $E_c$ and $E_v$ are the conduction and valence band edges, respectively, (interpreted as mobility edges in an amorphous semiconductor), and $E_{fn}$ and $E_{fp}$ are the electron and hole quasi-Fermi levels, respectively. The electron affinity $\chi_n$ is defined as $E_o - E_c$, and the hole affinity $\chi_p$ (also called the ionization energy) is defined as $E_o - E_v$; i.e., $\chi_p = \chi_n + E_g$, where $E_g = E_c - E_v$. Ignoring the longitudinal Dember effect and the spatial dependence of the effective densities of states $N_c$ and $N_v$, it can be shown (S. J. Fonash and S. Ashok, supra; S. J. Fonash, *Solar Cell Device Physics* (Academic Press, New York, 1981) pp. 56–63)) that the open-circuit voltage $V_{oc}$ is given generally by $$-eV_{oc} = \int \left[ \frac{\Delta\sigma_n}{\sigma} \frac{dE_c}{dx} + \frac{\Delta\sigma_p}{\sigma} \frac{dE_v}{dx} \right] dx \qquad (1)$$

where $\Delta\sigma_n(x)$ and $\Delta\sigma_p(x)$ are the excess electron and hole conductivities, respectively, and $\sigma(x)$ is the total conductivity under illumination. By use of the energy relations shown in FIG. 1, Eq. (1) can be put in the alternate form $$-eV_{oc} = \int_0^d \left[ \frac{\Delta\sigma}{\sigma} F_{eq} - \frac{\Delta\sigma_n}{\sigma} \frac{d\chi_n}{dx} - \frac{\Delta\sigma_p}{\sigma} \frac{d\chi_p}{dx} \right] dx \qquad (2)$$

where $\Delta\sigma = \Delta\sigma_n + \Delta\sigma_p$ is the total excess conductivity, $F_{eq} = (dE_o/dx)_{eq}$ is the gradient of the vacuum level in the dark, and the minus signs preceding the second and third terms arise from the sign conventions implicit in FIG. 1. The significance of Eq. (2) is that the affinity gradients $d\chi_n/dx$ and $d\chi_p/dx$ due to material property variations provide effective forces which act on carriers in precisely the same manner as the built-in electrostatic field.

Figure 2A:
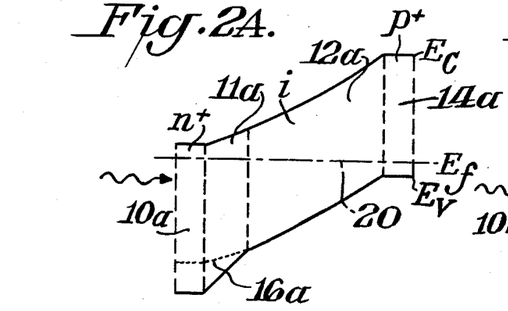
FIGS. 2A through 2D are equilibrium band diagrams showing the use of localized affinity gradients to suppress back diffusion wherein 2A and 2B relate to n-i-p structures while 2C and 2D relate to p-i-n structures, and band edges in the absence of grading are represented by dotted lines.
Figure 2B:
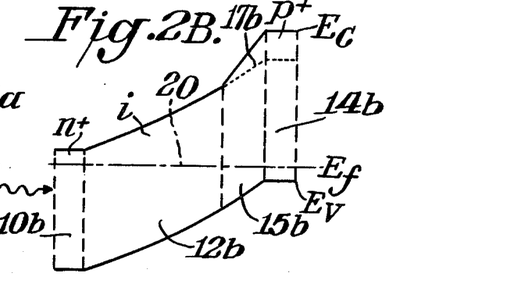
Figure 2C:
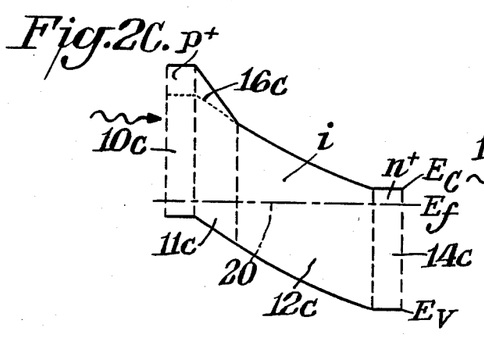
Figure 2D:
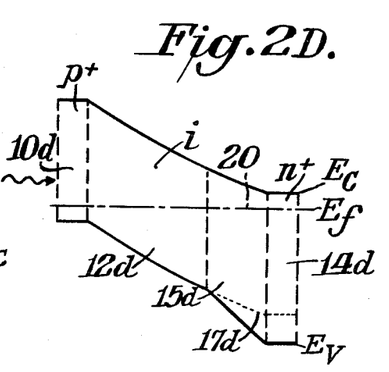
Figure 2E:
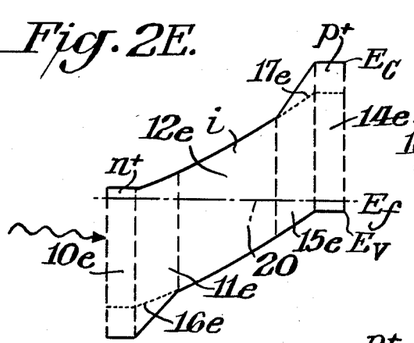
Figure 2F:
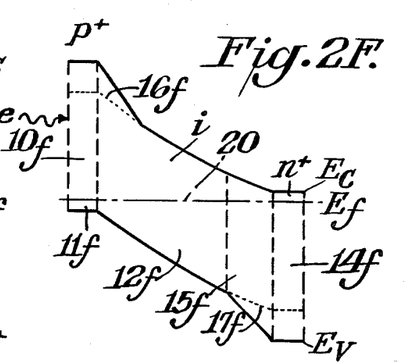
Figure 2G:
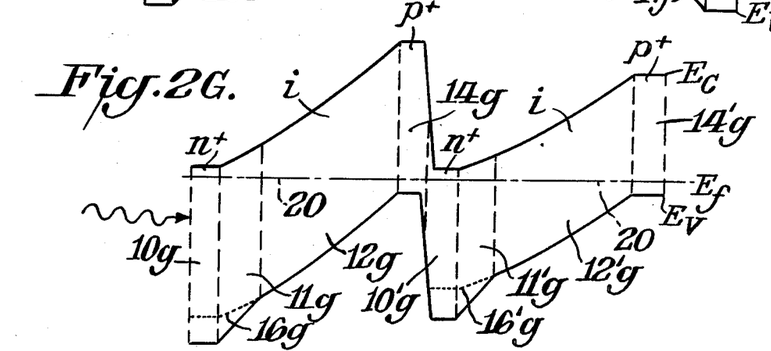
FIG. 2G shows the use of hole affinity gradients in a tandem n-i-p/n-i-p structure.

Generally speaking, the back-diffusion problem is most severe for carriers adjacent a contacting layer of opposite type. FIGS. 2A–2D inclusive, show band diagrams in thermal equilibrium for four possible applications of localized affinity gradient to oppose back-diffusion. In FIG. 2A, a hole affinity gradient adjacent the n+ layer 10a of an n-i-p device is used to suppress the back-diffusion of photogenerated holes. In FIG. 2B, an electron affinity gradient is used to suppress the back-diffusion of photogenerated electrons. FIGS. 2C and 2D illustrate the corresponding applications in a p-i-n device. In addition to the configurations shown, both electron and hole affinity gradients may be applied to a single device, or to any, or all constituents of a tandem or multi-junction device. Moreover, since gradients are confined to the primary light-absorbing layer 12a, 12b, 12c, etc., the principle can be applied to Schottky barrier, MIS, and semiconductorelectrolyte configurations as well. The profile and extent of the graded region are both process variables affording the cell designer important new degrees of freedom for the optimization of photovoltaic performance.

The graded affinity cell may be compared with the "wide-window", or heteroface a-Si, cell first produced by Hamakawa et al. (Y. Hamakawa, et al. *Appl. Phys. Letters* 43(7), 644 (1983)) and brought to efficiencies exceeding 10% by Catalano et al. (A. Catalano et al. *Proc. 16th IEEE Photovoltaic Specialists Conf.*, IEEE, New York, 1982 p. 1421). Here the p+ layer in a p-i-n configuration is composed of an a-SiC alloy of substantially greater optical gap than the unalloyed a-Si which comprises the remainder. This modification was introduced to minimize photon losses due to gap-narrowing in B-doped a-Si, and is so justified in Refs. (Hamakawa, Wa et al., Catalano et al. supra). In retrospect, however, it appears that the a-SiC/a-Si heteroface serves also as a blocking contact for back-diffusion of photogenerated electrons (F. Evangelisti, et al., *Appl. Phys. Letters* 44(8), 764 (1984)), and this accounts for much of the superiority of "wide-window" cells. Hence, the question arises whether an affinity gradient in the i-layer is more effective in minimizing recombination than an abrupt affinity discontinuity at the window-base interface. It is believed that it is, for two reasons: (a) Recent experiments with quantum well or "superlattice" structures (T. Tiedje, et al., *Proc. Int. Conf. Transport and Defects in Amorphous Semiconductors* - Mar. 1984, *J. Non-Cryst. Solids* (to be published) suggest that electron wave functions in a-Si maintain their coherence over distances of order 30 Å. Hence back-diffusing carriers can penetrate the potential barriers at the interface for a significant fraction of the thickness of the front contacting layer; (b) In any event, not all recombination takes place within the front contacting layer. Majority carrier concentration remains high for a considerable distance within the i-layer. It is estimated that the substantial shift of the majority carrier quasi-Fermi level in typical designs under maximum-power conditions is of order $(1-2) \times 10^4$ eV/cm, whence the majority carrier concentration requires several hundred Å to decay one decade. In other words, it is insufficient on both counts to attempt to arrest backdiffusing carriers precisely at the interface; rather, they must be prevented from approaching it.

THE GRADED AFFINITY CELL

In order to prove the efficacy of affinity grading, Applicant fabricated the configuration of FIG. 2A in the amorphous silicon-germanium alloy system. The desired hole affinity gradient was produced by tapering the alloy composition linearly from a-Si$_{80}$Ge$_{20}$ to pure a-Si over the front (radiationward) 390 Å of the i-layer, as shown schematically in FIG. 3. The n+ layer 10 was, of course, pure Si as well, to avoid the formation of an interface step. As control group and standard of comparison Applicant also fabricated, under identical conditions, a set of conventional (ungraded) alloy cells of uniform composition, spanning the range from pure Si to Si$_{50}$Ge$_{50}$ in approximately 10% increments. Thus, the graded affinity cell (GAC) is substantially comparable to the Si$_{80}$Ge$_{20}$ member of the control group. All cells were prepared by RF plasma decomposition of silane-germane mixtures in the presence of excess hydrogen. Substrates were Corning 7059 glass metallized with 1500 Å of electron beam-evaporated Mo, and held at 250° C. during deposition. The p+ layer was approximately 300 Å thick and doped with about 4% diborane in the gas phase. The i-layer was approximately 5000 Å thick overall, and not intentionally doped. The n+ layer was approximately 70 Å thick and doped with about 4% phosphine in the gas phase. Upper contact 21(FIG. 3A) was made with approximately 600 Å of electron beam-evaporated ITO (Indium Tin Oxide).

Figure 3:
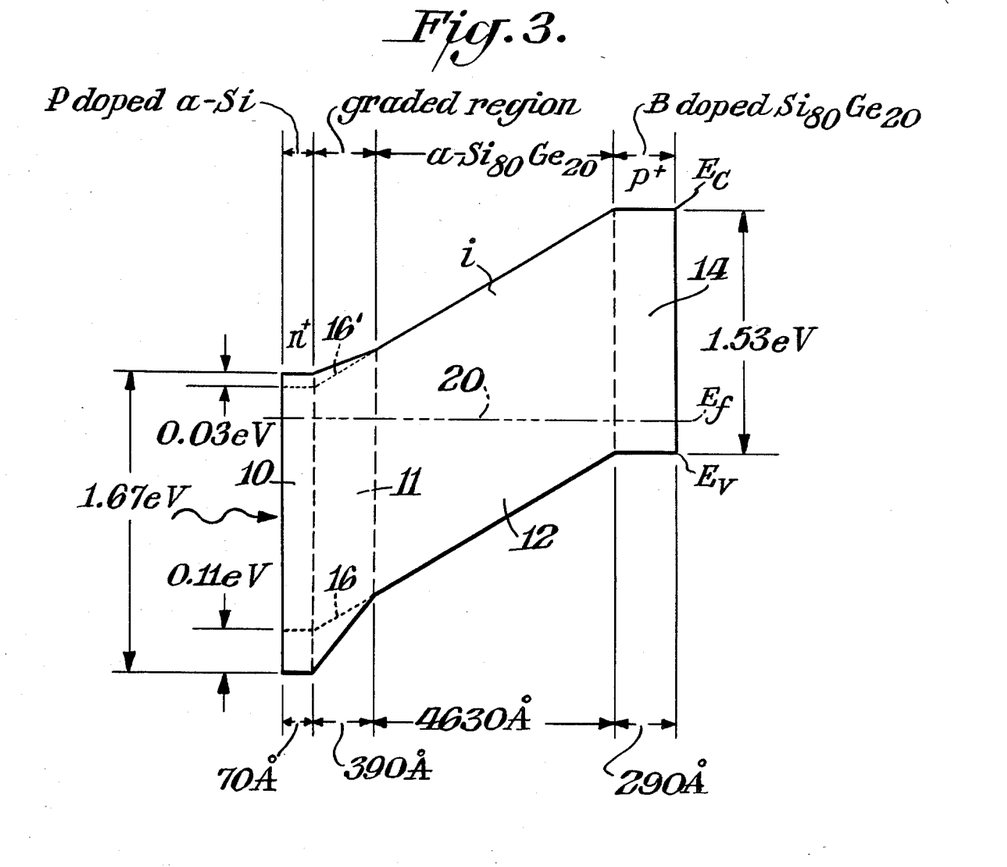
FIG. 3 is an equilibrium band diagram for a solar cell constructed according to this invention.

The parameters of the graded region of the GAC were chosen a priori on the following basis: Neglecting the Dember effect and $dN_v/dx$ as before, the hole current density $J_p$ can be written (S. J. Fonash et al., supra):

$$J_p = \mu_p p \left[ F - \frac{d\chi_p}{dx} \right] - \mu_p kT \frac{dp}{dx} \quad (3)$$

where $F = dE_o/dx$ is the gradient of the vacuum level under illumination and the remaining symbols have their usual meanings. In order that holes move in the $+x$ direction, the inequality $$\left| \frac{d\chi_p}{dx} \right| > \left| F - kT \frac{d(\ln(p))}{dx} \right| \quad (4)$$

must be satisfied. From the computer simulation of (G. A. Swartz, supra) it is estimated that $F \approx 3 \times 10^4$ eV/cm and $kTd(\ln(p))/dx \approx 6 \times 10^4$ eV/cm in the critical portion 11 of the i-layer 12 immediately adjacent the n+ layer 10, FIG. 3. This leaves a deficiency of at least $3 \times 10^4$ eV/cm to be provided by $d\chi_p/dx$. Unfortunately, the electron and hole affinities of a-SiGe alloys are not known. Hirose, (M. Hirose, *Proc. Int. Conf. Transport and Defects in Amorphous Semiconductors*, Mar., 1984, *J. Non-Cryst. Solids* (to be published) however, has recently reported the value 3.93 eV for the electron affinity of a-Si. Comparison with the accepted value 4.01 eV for crystalline Si suggests that electron affinities are relatively insensitive to structural change. It is therefore, assumed that the affinity difference $\Delta\chi_n = \chi_n(Si) - \chi_n(Ge)$, has the same value as in the crystalline state, namely, $-0.15$ eV. Adding the difference in mobility gaps, $\Delta E_g = E_g(Si) - E_g(Ge) \approx 0.70$ eV, yields $\Delta\chi_p \approx 0.55$ eV; i.e., about 79% of the gap widening occurs in the valence band edge and 21% in the conduction band edge. Assuming that $\chi_p$ is linear in composition, grading from 0 to 20% Ge in the space of 390 Å (refer to FIG. 3) produces an effective field of order $3 \times 10^4$ V/cm in the valence band, marginally sufficient to reverse the hole flux at the n+i interface. The accompanying electron affinity gradient, 16′, FIG. 3, is, of course, counterproductive, retarding the drift of electrons. (Note in FIG. 1 that $d\chi_n/dx$ and $d\chi_p/dx$ have opposite signs.) Fortunately the electron concentration gradient appears to be much smaller at this point, so that the electron diffusion current is easily overwhelmed by the remaining drift field.

EXAMPLE

Figure 3A:
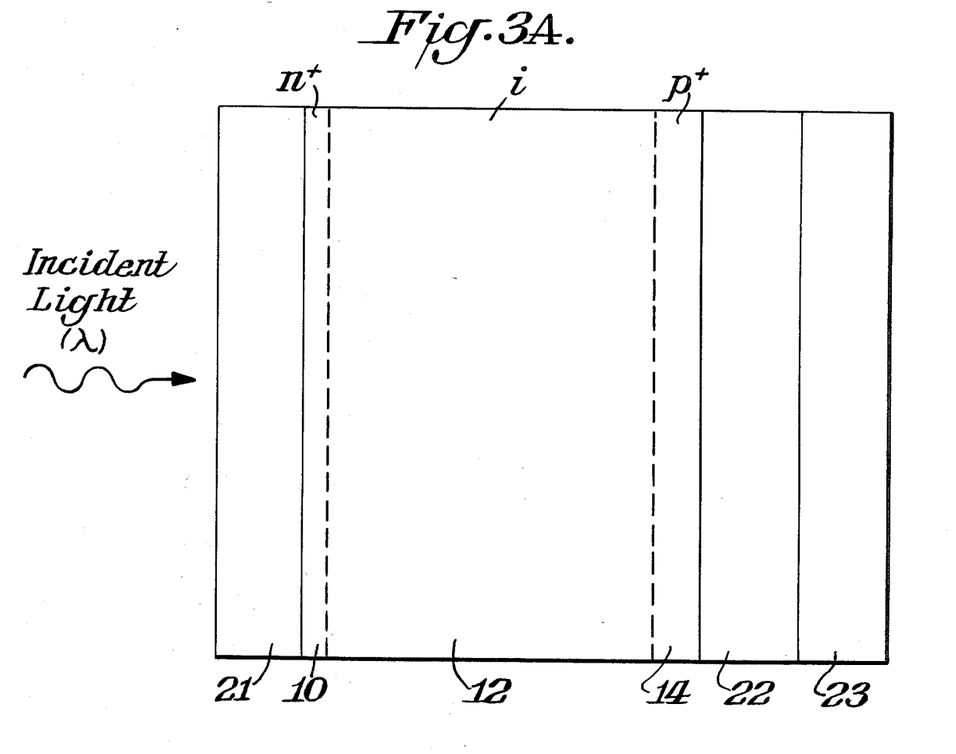
FIG. 3A is a side elevation view of the solar cell characterized by FIG. 3.

This invention was reduced to practice by fabrication of an n-i-p solar cell, the schematic band diagram for which is shown in FIG. 3. The cell per se is shown schematically in FIG. 3A. The individual cell components were made up as follows:

Substrate, back contact 22, FIG. 3A - Molybdenum 1500Å thick electron beam-evaporated on Corning 7059 glass, 1″ × 1″, approximately 0.04″ thick, component 23, FIG. 3A
Deposition Process - RF plasma (glow) Discharge
RF Voltage: 400 volts peak-to-peak for ion cleaning of Mo surface in argon, 360 volts peak-to-peak for deposition
Substrate Bias: −50 Volts DC
Self-Induced Plasma Voltage: −148 Volts DC
RF Power Density: 0.684 watts/sq. cm.

| Gas | Flow Rate (→ controllably changed to) |
|---|---|
| silane | 3.8 → 4.0 sccm |
| 5% germane: hydrogen | 3.98 → 0.0 sccm |

| -continued | |
|---|---|
| hydrogen | |
| 4.66% diborane: | 8.22 → 12.0 sccm (i layer) |
| hydrogen | 8.22 sccm (P layer) deposit |
| 4.29% phosphine: | 12.0 sccm (N layer) deposit |
| hydrogen | |
| hydrogen/hydrides ratio | 3.0 |
| Absolute Pressure | 200 millitorr |

| Layer | Thickness |
|---|---|
| N Layer (Front) | 70Å |
| Total i Layer | 5015Å |
| Graded Portion of i Layer | 386Å |
| P Layer (Back) | 292Å |
| Front Contact, 21, FIG. 3A Indium Tin Oxide (ITO)≈ | 600Å |
| Deposition Rate, i Layer | 1.286Å/sec |
| Substrate Temperature | 250° C. |

Figure 3B:
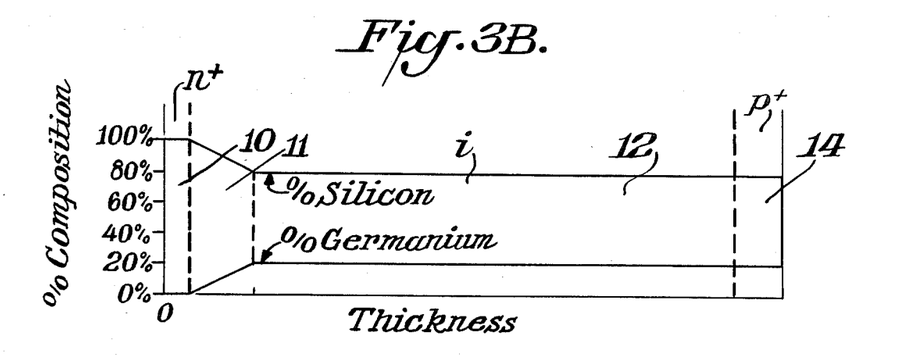

The solar cell was fabricated, in this Example, by tapering the composition of the a - $Si_{80}Ge_{20}$ alloy as shown in the Percent Compostion v. Thickness (instrinsic layer 12) plot FIG. 3B.

Build-up proceeded as a continuous operation from the bottom layer, substrate 23, through metallization 22, p+ layer 14, intrinsic (i) layer 12, n+ layer 10, and, finally, transparent conductive Indium-Tim Oxide (ITO) layer 21, the thickness of the central p-i-n layer (and graded affinity region 11) being shown in FIG. 3.

The general sequence of build-up was as follows, all times reported being Elapsed Time for each step:

RF Cleaning: 15 minutes in argon at 122 mTorr absolute pressure flowing at 17 sccm, 400 volts peak-to-peak at 13.6 MHz, grounded substrate at 260° C., plasma voltage ≈ −154 Volts DC Evacuation: 10 minutes at 31 mTorr absolute pressure, substrate at 247° C., DC Power −50 Volts Gas Equilibration: 10 minutes, 200 mTorr absolute pressure, 247° C., 3.8 sccm of silane, 8.22 sccm of diborane: hydrogen, 3.98 sccm of germane:hydrogen, 247° C. substrate temperature, 0RF voltage, −50 Volts DC substrate bias p+ Deposition: 1 minute, 45 seconds, 200 mTorr absolute pressure, 247° C., 3.8 sccm of silane, 8.22 sccm of diborane: hydrogen, 3.98 sccm of germane: hydrogen, 360 volts peak-to-peak RF at 13.6 MHz, −50 Volts DC substrate bias Evacuation: 15 minutes at 29 mTorr absolute pressure, substrate at 247° C.

Gas Purge: 5 minutes, 196 mTorr absolute pressure, 247° C., 3.8 sccm of silane, 8.22 sccm of hydrogen, 3.98 sccm of germane:hydrogen Evacuation: 5 minutes at 29 mTorr absolute pressure, substrate at 247° C.

Gas Equilibration: 5 minutes, 197 mTorr absolute pressure, 3.8 sccm of silane, 8.22 sccm of hydrogen, 3.98 sccm of germane: hydrogen, 247° C. substrate temperature, 0RF voltage, −50 Volts DC substrate bias i Layer Deposition Start: 196 mTorr absolute pressure, 3.8 sccm of silane, 8.22 sccm of hydrogen, 3.98 sccm of germane: hydrogen, 247° C. substrate temperature, 360 Volts peak-to-peak RF at 13.6 MHz, −50 Volts DC substrate bias Grading of i Layer: takes place over last 5 minutes of 65 minute i layer deposition as described in TABLE I, 247° C. substrate temperature, 360 Volts peak-to-peak RF at 13.6 MHz, −50 Volts DC substrate bias i Layer Deposition Finish: 200 mTorr absolute pressure, 4.0 sccm of silane, 12.0 sccm of hydrogen, 0.0 sccm of germane: hydrogen, 247° C. substrate temperature, 360 volts peak-to-peak RF at 13.6 MHz, −50 Volts DC substrate bias Gas Equilibration: 5 minutes, 200 mTorr absolute pressure, 4.0 sccm of silane, 12.0 sccm of phosphine:hydrogen, 0.0 sccm of germane:hydrogen, 246° C. substrate temperature 0 RF voltage, −50 Volts DC substrate bias n+ Deposition: 57 seconds, 200 mTorr absolute pressure, 4.0 sccm of silane, 12.0 sccm of phosphine: hydrogen, 0.0 sccm of germane:hydrogen, 247° C. substrate temperature, 360 volts peak-to-peak, RF at 13.6 MHz, −50 Volts DC substrate bias The development of the graded affinity region 11, FIG. 3, is the most critical part of the cell build-up from the standpoint of this invention.

In this Example, affinity grading was accomplished by tapering the composition of the intrinsic a-$Si_{80}Ge_{20}$ layer from 20% germanium content to substantially zero (refer to FIG. 3B) during a 5 minute duration manipulation of mass flow controllers simultaneously supplying the three gaseous components $SiH_4$, $GeH_4$:$H_2$, and $H_2$. The sequence is tabulated at 15 second intervals in TABLE I in terms of calculated gas flow rates (sccm).

It will be noted, Col. 1, that the $SiH_4$ supply rate was steadily increased from 3.80 to 4.00 sccm, whereas the $GeH_4$:$H_2$ was steadily decreased to zero while the flow rate of elemental $H_2$ was progressively increased from 8.33 to 12.11 sccm. The reason for increasing the $H_2$ supply is that it is essential to maintain the hydrogen/hydrides ratio (i.e. hydrogen/(silane+germane)) constant (in this instance at close to 3.0), otherwise the atomic structure of the amorphous semiconductor can be affected.

The measure resistivity for the n+ doped a-Si layer 10, FIG. 3, was 1320 ohm-cm, whereas that of p+ doped a-Si layer 14 was 21,100 ohm-cm. Some of the measured resistivity may be due to contact resistance during measurement. (Ideally, the resistivities should be lower than the foregoing, since reported resistivities as low as 53 ohm-cm and 2500 ohm-cm for n and p type films, respectively, can be found in the literature.)

The resistivity of p or n doped Si-Ge alloys is expected to be similar.

TABLE I

| GAC - Time log of last 5 minutes of i layer deposition calculated gas flow rates | | | |
|---|---|---|---|
| Time | $SiH_4$ | $GeH_4$:$H_2$ | $H_2$ |
| 5:05:00 | 3.80 | 3.98 | 8.33 |
| 5:05:15 | 3.81 | 3.78 | 8.52 |
| 5:05:30 | 3.82 | 3.58 | 8.71 |
| 5:05:45 | 3.83 | 3.39 | 8.90 |
| 5:06:00 | 3.84 | 3.19 | 9.06 |
| 5:06:15 | 3.85 | 2.99 | 9.24 |
| 5:06:30 | 3.86 | 2.78 | 9.51 |
| 5:06:45 | 3.87 | 2.58 | 9.69 |
| 5:07:00 | 3.88 | 2.39 | 9.88 |
| 5:07:15 | 3.89 | 2.19 | 10.05 |
| 5:07:30 | 3.90 | 1.99 | 10.23 |
| 5:07:45 | 3.91 | 1.79 | 10.41 |
| 5:08:00 | 3.92 | 1.59 | 10.58 |
| 5:08:15 | 3.93 | 1.40 | 10.76 |
| 5:08:30 | 3.94 | 1.20 | 10.94 |
| 5:08:45 | 3.95 | 1.00 | 11.12 |
| 5:09:00 | 3.96 | 0.79 | 11.39 |
| 5:09:15 | 3.97 | 0.59 | 11.57 |
| 5:09:30 | 3.98 | 0.40 | 11.75 |
| 5:09:45 | 3.99 | 0.20 | 11.93 |
| 5:10:00 | 4.00 | 0.00 | 12.11 |

Figure 4:
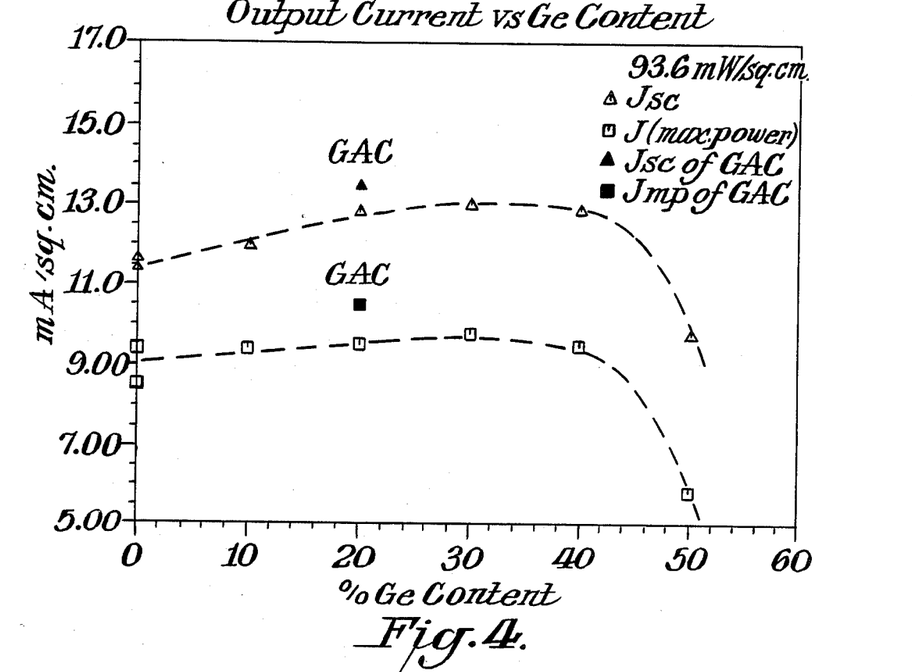
FIG. 4 is a plot of output current v. Ge content.
Figure 5:
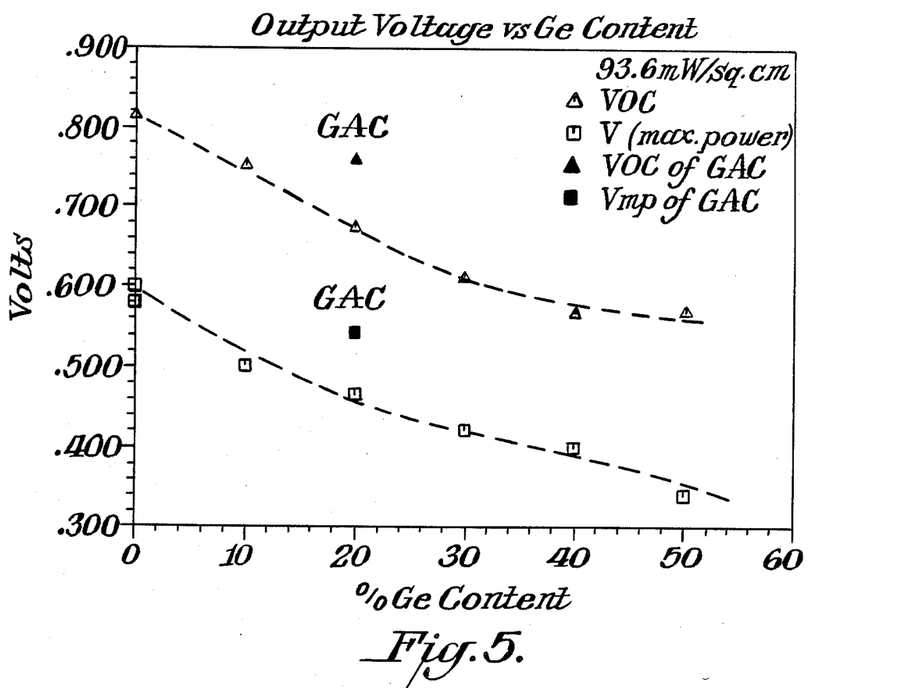
FIG. 5 is a plot of output voltage v. Ge content.
Figure 6:
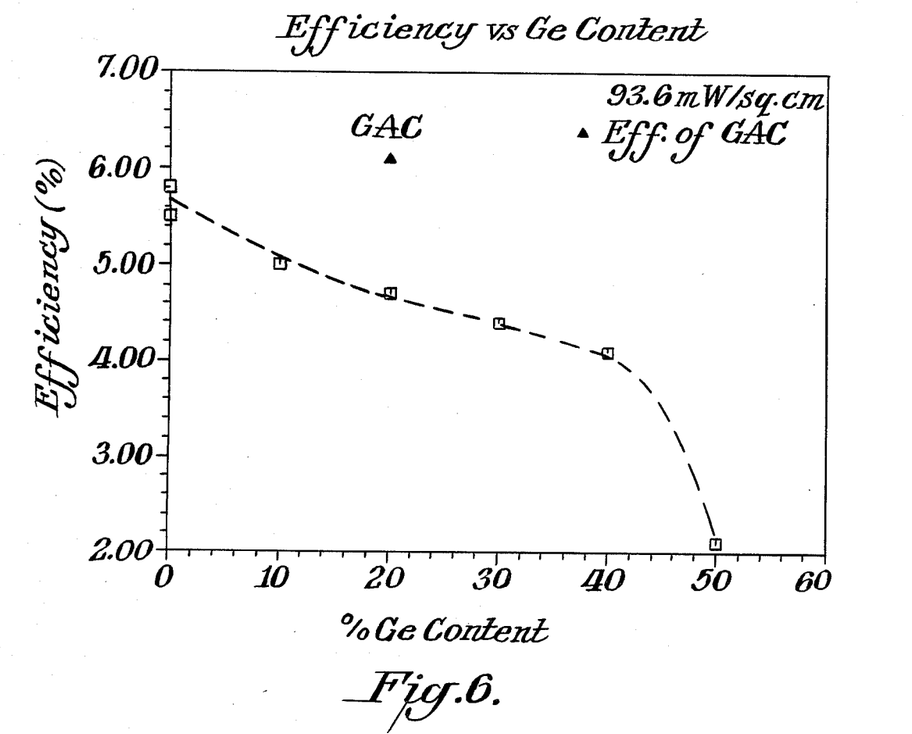
FIG. 6 is a plot of efficiency v. Ge content.

The measured photovoltaic parameters of the graded affinity cell and the control group of ungraded cells are shown in FIGS. 4, 5 and 6 plotted against percent Ge content of the i-layer. Measurements were performed under unfiltered radiation from an ELH bulb at a flux of 93.6 mW/cm$^2$. With respect to the comparable alloy cell, the graded affinity cell (plot points denoted GAC) shows a 12.7% improvement in $V_{oc}$ (FIG. 5), a 5.1% improvement in $J_{sc}$ (FIG. 4), and a 9.8% improvement in fill factor (not shown graphically), amounting in all to a 29.1% improvement in efficiency (FIG. 6). The efficiency of the graded cell is, in fact, higher than that of a-Si cells made under similar conditions, and, so far as is known, is the highest yet reported for single junction amorphous alloy cells. Beyond 40% Ge, the photovoltaic performance parameters drop precipitously.

It is of interest to compare the measured increase in $V_{oc}$ with that predicted by Eq. (2). The measured increase is 85 mV, whereas the algebraic sum (i.e., the difference) of the potential difference shown in FIG. 3 is about 80 mV. This agreement is probably fortuitous, because the prefactors in the second and third terms of Eq. (2) cannot simultaneously approach unity. Applicant believes, instead, that the principal effect of affinity grading is perhaps to increase the excess carrier concentration in the intrinsic layer 11 and 12 by eliminating the recombination sink in the n+ layer 10. This increased carrier concentration is transported by the combined effect of the built-in field and the hole affinity gradient. Hence, both the first and third terms of the integrand contribute to the increase in $V_{oc}$, with the primary contribution coming from the first term.

The graded affinity cell described herein was designed in accordance with the simplest considerations, solely to establish the validity of a general principle. No effort was made to achieve maximum efficiency and no systematic optimization of the design was attempted. It appears that a larger $\Delta\chi_p$ extending over a longer region would be beneficial. This can be achieved, within the a-SiGe system, specifically, by increasing the Ge content of the i-layer to as much as 40%, thereby lowering the optical gap to about 1.4 eV, close to the optimum for AM1 insolation (J. J. Loferski, *J. Appl. Phys.* 27, 777 (1956)).

Recent photoemission studies in the a-SiN system (M. Hirose, supra) indicate that the majority of the gap change occurs in the valence band; whereas similar studies in the a-SiC system (F. Evangelisti et al., supra), indicate a valence band discontinuity near zero. Thus, electron and hole affinities can be independently manipulated, and all four configurations depicted in FIGS. 2A through 2D can be obtained. The very wide gaps attainable in these systems raise the possibility of affinity differences approaching 0.5 eV. Combinations of these systems permit the simultaneous elimination of recombination sinks near both front and rear contacting layers, promising still further increases in photovoltaic efficiency.

All the foregoing methods of producing affinity gradients apply to alteration of the gross chemical composition of the graded layer as in the Example. The configurational freedom available in amorphous materials also permits the production of affinity gradients in a chemically homogeneous semiconductor by alteration of the manner or conditions of deposition. Thus the optical gap of hydrogenated a-Si prepared by glow discharge decomposition of silane can be varied over the range 1.6 to 1.9 eV by varying the incorporated hydrogen content (H. Fritzsche, *Solar Energy Materials* 3, 447 (1980)). The hydrogen content in turn is a function of numerous deposition parameters, including substrate temperature, substrate bias, RF power level, silane concentration and flow rate, and residual system pressure (J. C. Knights, *Jpn. J. Appl. Phys.* 18, Suppl. 18-1, 101 (1979), H. Okamoto, T. Hamaguchi, Y. Nitta, and Y. Hamakawa, *J. Non-Cryst. Solids* 35–36, 201 (1980)). Still further variations can be produced by introducing halogens such as fluorine during deposition (A. Madan, S. R. Ovshinsky, and E. Benn, *Phil. Mag.* B40, 259 (1979)), or by the use of alternative deposition processes such as reactive sputtering (F. R. Feffrey, H. R. Shanks, and G. C. Danielson, *J. Non-Cryst. Solids* 35–36, 261 (1980)) and chemical vapor deposition (B. A. Scott, in *Semiconductors and Semimetals,* Vol. 21, ed. J. Pankove (Academic Press, New York, 1984)). It is not completely clear whether the resultant variations in optical gap produce equivalent variations in mobility gap and, if so, how these changes are apportioned between valence and conduction band mobility edges.

MISCELLANEOUS

Applicability of this invention is limited to amorphous type semiconductors displaying low carrier mobility, e.g., less than about 50 cm$^2$/Vsec.

Migration of photogenerated carriers is the result of both diffusion and electrostatic field, the former being random in nature and the latter directed and due to the potential distribution within the semiconductor.

Semiconductors inevitably contain small amounts of $H_2$ and $N_2$ due to conditions of manufacture, and the effects of these substances are largely unknown; however, operation of such devices is probably affected by this fact.

This invention is applicable to alloys per se, which must be distinguished from doping.

It is helpful to visualize the individual transit of holes and electrons as bubbles and bird shot, respectively. The holes, then, ascend i.e., (to the right) the steep slopes bounding the graded region 11, FIG. 3, whereas the shot descend, thereby affecting a selective separation of the carriers as hereinbefore described. It will be understood that carriers are created by two principal causes: (1) thermal energy and (2) optical energy. In any case, the less the slopes of the equilibrium band diagrams of FIGS. 2A through 2G, and FIG. 3, the smaller is the inherent electric field and the more advantageous the circumstances for the utilization of this invention.

By "back-diffusion" is meant carrier diffusion against, or opposite to, the direction of collection due to the electric field present in the same region.

What is claimed is:

1. An improved photovoltaic cell comprising at least a front electrically conductive layer upon which radiation is incident and a back electrically conductive layer, between which is sandwiched a primary light-absorbing layer of substantially intrinsic amorphous semiconducting material displaying low photogenerated carrier mobility below about 50 cm$^2$/Voltsecond, the constitution of said primary light-absorbing layer being fabricated to provide an affinity gradient at one end of said primary light-absorbing layer adjacent one of said front and back electrically conductive layers for reducing back diffusion of a preselected species of photogenerated carrier chosen from electrons and holes to thereby reduce non-productive recombination with carriers of opposite type.

2. An improved photovoltaic cell according to claim 1 wherein both ends of said primary light-absorbing layer of amorphous semiconducting material are provided with appropriate affinity gradients to thereby prevent non-productive recombination with carriers of opposite type.

3. An improved photovoltaic cell according to claim 1 comprising at least two primary light-absorbing layers in tandem wherein at least one of said primary light-absorbing layers is provided with an appropriate affinity gradient to thereby prevent non-productive recombination with carriers of opposite type.

4. An improved photovoltaic cell according to claim 3 wherein each primary light absorbing layer is provided with the appropriate affinity gradient to thereby prevent non-productive recombination with carriers of opposite type.

5. An improved photovoltaic cell according to claim 1 wherein said primary light-absorbing layer is selected from the group consisting of SiGe, SiC, SiN, SiO, SiSn, and elemental Si.

6. In the method of manufacturing an improved photovoltaic cell comprising at least a front electrically conductive layer upon which radiation is incident and a back electrically conductive layer between which is sandwiched a primary light-absorbing layer of substantially intrinsic amorphous semiconducting material displaying low photogenerated carrier mobility below about 50 $cm^2/V$-second, the step of providing an affinity gradient for said primary light-absorbing layer in the region adjacent one of said front and back electrically conductive layers for reducing back diffusion of a preselected species of photogenerated carrier chosen from electrons and holes to thereby reduce non-productive recombination with carriers of opposite type.

7. The method of manufacturing an improved photovoltaic cell according to claim 6 wherein said affinity gradient is fabricated utilizing alloy compostion tapering, sputtering, chemical vapor deposition, glow discharge, hydrogenation, fluorination, and combinations thereof.

8. The method of manufacturing an improved photovoltaic cell according to claim 6 wherein said primary light absorbing layer is fabricated from a-SiGe and said affinity gradient is provided by tapering the composition of at least one end of said primary absorbing layer during manufacture by simultaneously supplying flowing streams of silane, germane: hydrogen and hydrogen in varying amounts preselected to taper the composition of at least one end region from the original composition of said a-SiGe to a terminal value at the distal end of said end region of substantially a-Si, zero Ge.

* * * * *